(12) United States Patent
Ouyang et al.

(10) Patent No.: US 9,935,036 B2
(45) Date of Patent: Apr. 3, 2018

(54) PACKAGE ASSEMBLY WITH GATHERED INSULATED WIRES

(71) Applicant: Intel Corporation, Santa Clara, CA (US)

(72) Inventors: Gong Ouyang, Olympia, WA (US); Beom-Taek Lee, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 141 days.

(21) Appl. No.: 15/036,385

(22) PCT Filed: Jun. 26, 2015

(86) PCT No.: PCT/US2015/038109
§ 371 (c)(1),
(2) Date: May 12, 2016

(87) PCT Pub. No.: WO2016/209286
PCT Pub. Date: Dec. 29, 2016

(65) Prior Publication Data
US 2017/0207146 A1    Jul. 20, 2017

(51) Int. Cl.
*H01L 23/48* (2006.01)
*H01L 25/07* (2006.01)
*H01L 23/00* (2006.01)

(52) U.S. Cl.
CPC .............. *H01L 23/48* (2013.01); *H01L 24/45* (2013.01); *H01L 25/07* (2013.01); *H01L 2224/48091* (2013.01); *H01L 2924/181* (2013.01)

(58) Field of Classification Search
CPC . H01L 2224/49173; H01L 2224/49176; H01L 2224/4901
See application file for complete search history.

(56) References Cited

U.S. PATENT DOCUMENTS

| | | | | |
|---|---|---|---|---|
| 6,812,580 | B1 * | 11/2004 | Wenzel | H01L 23/50 257/691 |
| 7,825,527 | B2 * | 11/2010 | Bereza | H01L 23/66 257/692 |
| 2004/0119172 | A1 | 6/2004 | Downey et al. | |
| 2009/0224404 | A1 | 9/2009 | Wood et al. | |
| 2010/0176501 | A1 | 7/2010 | Zaccardi | |
| 2014/0048919 | A1 | 2/2014 | Bathan et al. | |

(Continued)

OTHER PUBLICATIONS

International Search Report and Written Opinion dated Mar. 30, 2016 for International Application No. PCT/US2015/038109, 9 pages.

*Primary Examiner* — Raj R Gupta
(74) *Attorney, Agent, or Firm* — Schwabe, Williamson & Wyatt, P.C.

(57) ABSTRACT

Some embodiments of the present disclosure describe an integrated circuit (IC) package assembly having first, second, and third insulated wires wire bonded with die pads on an IC die, with an outer surface of the second insulated wire located at a distance of less than an outer cross-sectional diameter of the second insulated wire from an outer surface of the first insulated wire at a first location and located at a distance of less than the outer cross-sectional diameter from an outer surface of the third insulated wire at a second location. Other embodiments may be described and/or claimed.

25 Claims, 9 Drawing Sheets

(56) References Cited

U.S. PATENT DOCUMENTS

2014/0118966 A1\* 5/2014 Laturell .............. H01L 23/4985
  361/749
2015/0102478 A1 4/2015 Suthiwongsunthorn et al.

\* cited by examiner

PACKAGE ASSEMBLY WITH GATHERED INSULATED WIRES

CROSS REFERENCE TO RELATED APPLICATIONS

The present application is a national phase entry under 35 U.S.C. § 371 of International Application No. PCT/US2015/038109, filed Jun. 26, 2015, entitled "PACKAGE ASSEMBLY WITH GATHERED INSULATED WIRES", which designated, among the various States, the United States of America. The Specification of the PCT/US2015/038109 Application is hereby incorporated by reference.

FIELD

Embodiments of the present disclosure generally relate to the field of interconnects for integrated circuit (IC) package assemblies, and more particularly, to wire bond configurations and methods.

BACKGROUND

In some applications, wire bonding rather than flip chip packaging is used as die to PCB or die to package interconnects. However, interconnects formed using typical wire bonding techniques may have signal integrity issues such as high insertion, return, or margin loss and channel resonance due to inductive impedance discontinuity and high cross talk between the wires.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Some embodiments of the present disclosure describe an integrated circuit (IC) package assembly with gathered insulated bond wires and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," or "in some embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

Figure 1:
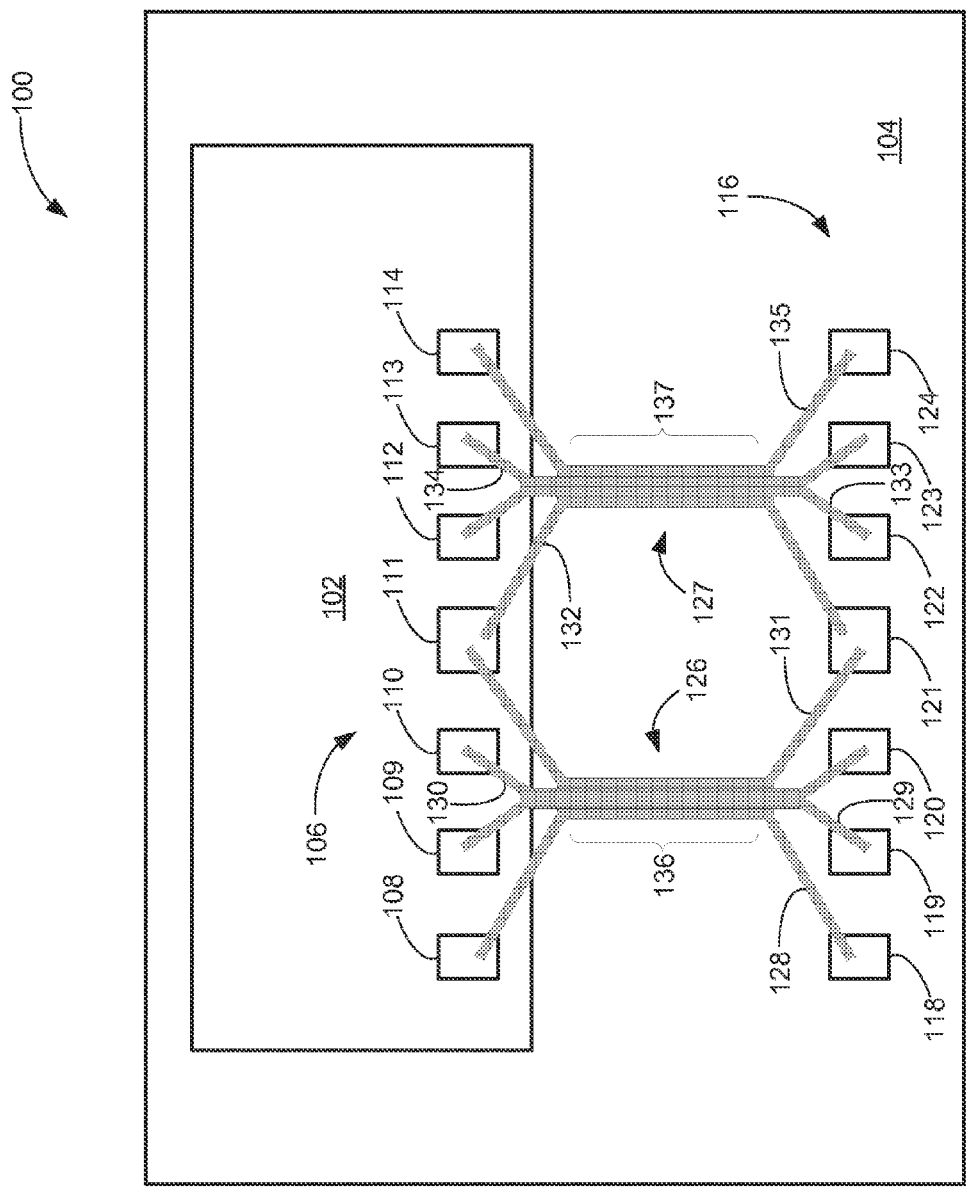
FIG. 1 schematically illustrates a top view of an example integrated circuit (IC) package assembly with gathered insulated wires in a ribbon configuration, in accordance with some embodiments.

FIG. 1 schematically illustrates a top view of an example integrated circuit (IC) package assembly 100 with gathered insulated wires in a ribbon configuration, in accordance with some embodiments. In some embodiments, the IC package assembly 100 may include one or more IC dies (hereinafter "die 102") that may be electrically and/or physically coupled with a package (sometimes referred to as a "package substrate"). In some embodiments, the die 102 may be electrically coupled with a printed circuit board (PCB) 104.

In embodiments, the die 102 may generally include a semiconductor substrate, one or more device layers, and one or more interconnect layers. The semiconductor substrate may be substantially composed of a bulk semiconductor material such as, for example, silicon, in some embodiments. The device layer may represent a region where active devices such as transistor devices are formed on the semiconductor substrate. The device layer may include, for example, structures such as channel bodies and/or source/drain regions of transistor devices. The interconnect layer may include interconnect structures that are configured to route electrical signals to or from the active devices in the device layer. For example, the interconnect layer may include trenches and/or vias to provide electrical routing and/or contacts. In some embodiments, the die-level interconnect structures may be configured to route electrical signals between the die 102 and other electrical devices. The electrical signals may include, for example, input/output (I/O) signals and/or power/ground signals that are used in connection with operation of the die 102.

The circuit board 104 may be a printed circuit board (PCB) composed of an electrically insulative material such as an epoxy laminate. For example, the circuit board 104 may include electrically insulating layers composed of materials such as polytetrafluoroethylene, phenolic cotton paper materials such as Flame Retardant 4 (FR-4), FR-1, cotton paper, and epoxy materials such as CEM-1 or CEM-3, or woven glass materials that are laminated together using an epoxy resin prepreg material. Interconnect structures (not shown) such as traces, trenches or vias may be formed through the electrically insulating layers to route the electrical signals of the die 102 through the circuit board 104. The circuit board 104 may be composed of other suitable materials in other embodiments. In some embodiments, the circuit board 104 may be a motherboard or other PCB in a computing device (e.g., PCB 1142 of FIG. 11).

The die 102 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 102 may be, include, or be a part of a radio frequency (RF) die. In other embodiments, the die may be, include, or be a part of a processor, memory, system-on-chip (SoC), or application specific integrated circuit (ASIC). As shown, the die 102 may include a plurality of die pads 106 that may include a first die pad 108, a second die pad 109, a third die pad 110, a fourth die pad 111, a fifth die pad 112, a sixth die pad 113, and a seventh die pad 114. The PCB 104 may include a plurality of PCB pads 116 that may include a first PCB pad 118, a second PCB pad 119, a third PCB pad 120, a fourth PCB pad 121, a fifth PCB pad 122, a sixth PCB pad 123, and a seventh PCB pad 124.

In some embodiments, the die 102 may be electrically coupled with the PCB 104 with a first plurality of insulated wires 126 and a second plurality of insulated wires 127 electrically coupling the plurality of die pads 106 to the plurality of PCB pads 116. In various embodiments, the use of insulated wires may allow bond wires to touch without shorting. In some embodiments, the first plurality of insulated wires 126 may include a first insulated wire 128, a second insulated wire 129, a third insulated wire 130, and a fourth insulated wire 131. The second plurality of insulated wires 127 may include a fifth insulated wire 132, a sixth insulated wire 133, a seventh insulated wire 134, and an eighth insulated wire 135 in various embodiments. In some embodiments, the first insulated wire 128, the fourth insulated wire 131, the fifth insulated wire 132, and the eighth insulated wire 135 may be ground (Vss) wires; the second insulated wire 129 and the third insulated wire 130 may be a first differential signal wire pair (e.g., Sig+ and Sig−, respectively); and the sixth insulated wire 133 and the seventh insulated wire 134 may be a second differential signal wire pair. In some embodiments, a single ended signaling insulated wire may be used rather than or in addition to a differential signal wire pair. In some embodiments, at least one of the first insulated wire 128, the second insulated wire 129, the third insulated wire 130, or the fourth insulated wire 131 may be less than or equal to 700 microns in length. In some embodiments, the insulated wires may be approximately 650 microns long. However, in other embodiments, the insulated wires may be longer or shorter.

As shown, in some embodiments, the first insulated wire 128 may have a first end coupled with the first die pad 108 and a second end coupled with the first PCB pad 118. The second insulated wire 129 may have a first end coupled with the second die pad 109 and a second end coupled with the second PCB pad 119. The third insulated wire 130 may have a first end coupled with the third die pad 110 and a second end coupled with the third PCB pad 120. The fourth insulated wire 131 may have a first end coupled with the fourth die pad 111 and a second end coupled with the fourth PCB pad 121. The fifth insulated wire 132 may have a first end coupled with the fourth die pad 111 and a second end coupled with the fourth PCB pad 121. The sixth insulated wire 133 may have a first end coupled with the fifth die pad 112 and a second end coupled with the fifth PCB pad 122. The seventh insulated wire 134 may have a first end coupled with the sixth die pad 113 and a second end coupled with the sixth PCB pad 123. The eighth insulated wire 135 may have a first end coupled with the seventh die pad 114 and a second end coupled with the fourth PCB pad 124, in various embodiments. In some embodiments, more than one insulated wire may be coupled with the same die pad and/or PCB pad, as is shown for the fourth insulated wire 131 and the fifth insulated wire 132 which are both coupled with the fourth die pad 111 and the fourth PCB pad 121. In various embodiments, each die pad and/or PCB pad may be coupled with no more than one insulated wire.

In some embodiments, the distance between bonding locations of insulated wires on different die pads or different PCB pads may be approximately 200 microns. For example, in some embodiments, the distance between the first insulated wire 128 on the first die pad 108 and the second insulated wire 129 on the second die pad 109 may be approximately 200 microns and the distance between the second insulated wire 129 on the second PCB pad 119 and the third insulated wire 130 on the third PCB pad 120 may be approximately 200 microns. The spacing of the insulated wires at the bonding locations may be less than or greater than 200 microns in some embodiments. In various embodiments, the differential pair-to-pair pitch at the bonding pads may be approximately 600 microns but may differ in some embodiments.

In some embodiments, the first plurality of insulated wires 126 and the second plurality of insulated wires 127 may be coupled with the plurality of die pads 106 and the plurality of PCB pads 116 by wire bonding. In various embodiments, the insulated wires may be ball bonded or wedge bonded. As shown, the first plurality of insulated wires 126 may extend in parallel along a gathered region 136 and the second plurality of insulated wires 127 may extend in parallel along a gathered region 137. In some embodiments, the location of the insulated wires in gathered regions may reduce one or more wire loop areas formed by signal-ground bond wire pairs or differential signal wire pairs which may reduce impedance discontinuity and crosstalk in comparison to typical wire arrangements that are not located together in gathered regions. In some embodiments, the reduced wire loop areas and improved signal integrity may allow longer bond wire length than typical wire arrangements, which may allow for additional flexibility in the design of bond wire configurations. With reduced loop area, the self and mutual inductance of the signal wires may be reduced and the self and mutual capacitance of the signal wires may be increased, reducing impedance and crosstalk.

In some embodiments, the plurality of insulated wires 126 may be in a ribbon configuration in the gathered region 136 such that an outer surface of the second insulated wire 129 may be in contact with an outer surface of the first insulated wire 128 and an outer surface of the third insulated wire 130, with the outer surface of the third insulated wire 130 also in contact with an outer surface of the fourth insulated wire 131. In some embodiments, the first insulated wire 128 touches the second insulated wire 129 along at least a portion of the gathered region 136 and the third insulated wire 130 touches both the second insulated wire 129 and the fourth insulated wire 131 along at least a portion of the gathered region 136.

Although the plurality of insulated wires 126 are shown as being in contact in the gathered region 136, in some embodiments, the insulated wires 126 may not be in contact with each other but may be located such that an outer surface of the second insulated wire 129 is located at a distance of less than an outer cross-sectional diameter of the second insulated wire 129 from an outer surface of the first insulated wire 128 at a first location in the gathered region 136 and the outer surface of the second insulated wire 129 is located at a distance of less than the outer cross-sectional diameter of the second insulated wire 129 from an outer surface of the third insulated wire 130 at a second location in the gathered region 136. In various embodiments, an adhesive, such as an epoxy based material, may cover at least a portion of the gathered region 136 and/or the gathered region 137. In some embodiments, the outer cross-sectional diameter of the second insulated wire 129 compared in relation to the position of the second insulated wire to the outer surface of the first and third insulated wires may be a greatest outer cross-sectional diameter of the second insulated wire 129 In various embodiments, the outer cross-sectional diameter of the second insulated wire 129 compared in relation to the position of the second insulated wire to the outer surface of the first and third insulated wires may be an outer cross-sectional diameter of the second insulated wire at the location on the second insulated wire nearest to the outer surface of the first insulated wire when measuring the distance to the first insulated wire and at the location on the second insulated wire nearest to the outer surface of the third insulated wire when measuring the distance to the third insulated wire.

In some embodiments, the IC package assembly 100 may be included as a part of or coupled with a silicon photonics module and may be a driver IC module and/or receiver for the silicon photonics module. The IC package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC package assembly 100 may be used in some embodiments.

Figure 2:
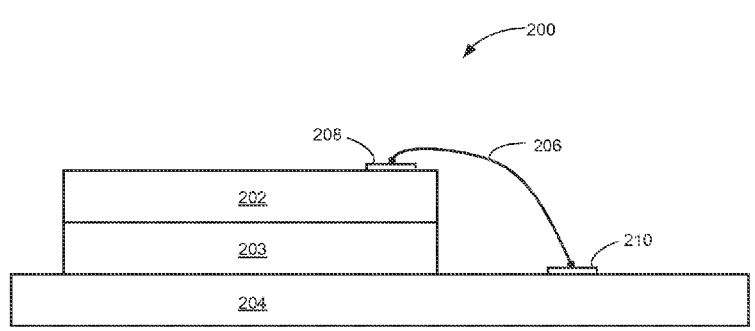
FIG. 2 schematically illustrates a side view of an example IC package assembly with gathered insulated wires in a ribbon configuration, in accordance with some embodiments.

FIG. 2 schematically illustrates a side view of an example IC package assembly 200 with gathered insulated wires that may be in a ribbon configuration, in accordance with some embodiments. In some embodiments, the IC package assembly 200 may include one or more IC dies (hereinafter "die 202") electrically and/or physically coupled with a package 203 (sometimes referred to as a "package substrate"). In some embodiments, the die 202 may be electrically coupled with a PCB 204. In some embodiments, the package 203 may not be present. In various embodiments, the package 203 may include another IC die mounted in a flip-chip configuration on the PCB 204 such that the die 202 is mounted on the PCB 204 along with the package 203 including the other die in a chip-on-chip (COC) configuration.

In various embodiments, the die 202 may be coupled with the PCB 204 using a plurality of gathered insulated wires having first ends wire bonded to a plurality of die pads on the die and second ends wire bonded to a plurality of PCB pads on the PCB 204. As shown, the plurality of insulated wires may include insulated wire 206, the plurality of die pads may include die pad 208, and the plurality of PCB pads may include PCB pad 210. In some embodiments, the IC package assembly 200 may be a side view of the IC package assembly 100 shown in FIG. 1, with the die 202 corresponding to the die 102; the PCB 204 corresponding to the PCB 104; the insulated wire 206 corresponding to the first insulated wire 128; the die pad 208 corresponding to the first die pad 108; and the PCB pad 210 corresponding to the first PCB pad 118.

The package 203 may include electrical routing features such as, for example, traces, pads, through-holes, vias, or lines configured to route electrical signals to or from the die 202. For example, the package 203 may be configured to route electrical signals between the die 202 and components for wireless communication that are integrated within the package assembly, or between the die 202 and the circuit board 204, or between the die 202 and another electrical component (e.g., another die, interposer, interface, component for wireless communication, etc.) coupled with the package 203. In some embodiments, the package 203 may include a multi-layer package assembly with integrated components for wireless communication. The wireless communication may include, for example, short range wireless data transfer between portable devices and/or wireless displays or high speed wireless communication between peer devices.

Package-level interconnects, such as solder balls, may be coupled with the package 203 and/or the circuit board 204 to form corresponding solder joints that are configured to further route the electrical signals between the package 203 and the circuit board 204. Other suitable techniques to physically and/or electrically couple the package 203 with the circuit board 204 may be used in other embodiments.

Figure 3:
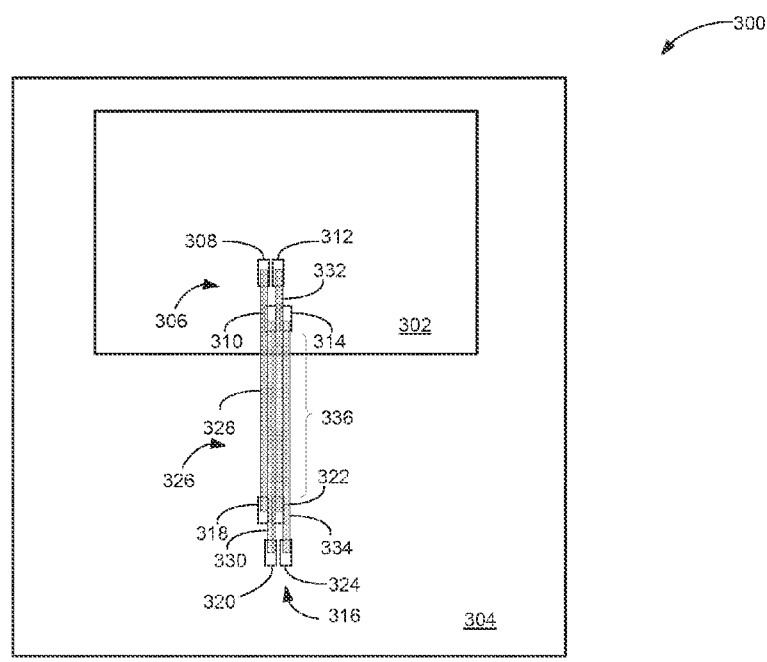
FIG. 3 schematically illustrates a top view of an IC package assembly with die pads in a staggered configuration, in accordance with some embodiments.

FIG. 3 schematically illustrates a top view of an IC package assembly 300 with die pads in a staggered configuration, in accordance with some embodiments. In various embodiments, the IC package assembly 300 may include one or more IC dies 302 that may be electrically and/or physically coupled with a PCB 304. In some embodiments, the die 302 may include a plurality of die pads 306 that may include a first die pad 308, a second die pad 310, a third die pad 312, and a fourth die pad 314 that may be arranged in a staggered configuration as shown. In various embodiments, the plurality of die pads 306 may be spaced apart in a first direction and at least one of the die pads may be spaced apart in a second direction with respect to at least one of the other die pads. In some embodiments, the first direction may correspond to a direction across the plurality of insulated wires 326 and the second direction may correspond to a direction normal to the first direction or longitudinally along at least one of the plurality of insulated wires 326. As shown, in various embodiments, the first die pad 308 and the third die pad 312 may be spaced apart from each other in the first direction, and the second die pad 310 and the fourth die pad 314 may be spaced apart from each other in the first direction. As shown, in some embodiments, the first die pad 308 and the third die pad 312 may be spaced apart from the second die pad 310 and the fourth die pad 314 in the second direction.

The PCB 304 may include a plurality of PCB pads 316 that may include a first PCB pad 318, a second PCB pad 320, a third PCB pad 322, and a fourth PCB pad 324. In some embodiments, the plurality of PCB pads 316 may be arranged in a staggered configuration. In various embodiments, the plurality of PCB pads 316 may be spaced apart in a first direction and at least one of the PCB pads 316 may be spaced apart in a second direction with respect to at least one of the other PCB pads. In some embodiments, the first direction may correspond to a direction across the plurality of insulated wires 326 and the second direction may correspond to a direction normal to the first direction or longitudinally along at least one of the plurality of insulated wires 326. As shown, in various embodiments, the first PCB pad 318 and the third PCB pad 322 may be spaced apart from each other in the first direction, and the second PCB pad 320 and the fourth PCB pad 324 may be spaced apart from each other in the first direction. As shown, in some embodiments, the first PCB pad 318 and the third PCB pad 322 may be spaced apart from the second PCB pad 320 and the fourth PCB pad 324 in the second direction.

In some embodiments, the die 302 may be electrically coupled with the PCB 304 with a plurality of insulated wires 326 electrically coupling the plurality of die pads 306 with the plurality of PCB pads 316. The plurality of insulated wires 326 are shown in a partially transparent x-ray view in order to show where the plurality of die pads 306 and the plurality of PCB pads 316 may be located in various embodiments. As shown, a first insulated wire 328 may have a first end wire bonded to the first die pad 308 and a second end wire bonded to the first PCB pad 318. The second insulated wire 330 may have a first end wire bonded to the second die pad 310 and a second end wire bonded to the second PCB pad 320. The third insulated wire 332 may have a first end wire bonded to the third die pad 312 and a second end wire bonded to the third PCB pad 322. The fourth insulated wire 334 may have a first end wire bonded to the fourth die pad 314 and a second end wire bonded to the fourth PCB pad 324. In various embodiments, the positioning of the die pads 306 and the PCB pads 316 in staggered configurations may allow the plurality of insulated wires 326 to have a gathered region that runs for a greater proportion of their length, which may reduce loop areas between the insulated wires and improve various electrical performance characteristics.

Figure 4:
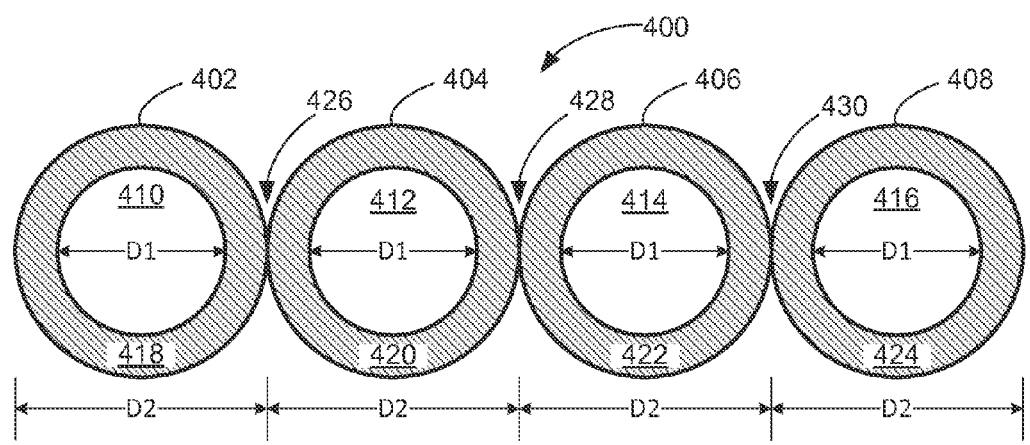
FIG. 4 schematically illustrates a cross-section side view of gathered insulated wires in a ribbon configuration, in accordance with some embodiments.

FIG. 4 schematically illustrates a cross-section side view of a plurality of gathered insulated wires 400 in a ribbon configuration, in accordance with some embodiments. In some embodiments, the plurality of gathered insulated wires 400 may include a first insulated wire 402, a second insulated wire 404, a third insulated wire 406, and a fourth insulated wire 408. In various embodiments, each of the insulated wires 402, 404, 406, and 408 may include a bond wire core 410, 412, 414, or 416, respectively, which may be made of copper, gold, or another electrically conductive material, for example. In various embodiments, each of the insulated wires 402, 404, 406, and 408 may have an insulator coating 418, 420, 422, or 424, respectively, that may be formed of a material based on an epoxy or polyamide, for example. In various embodiments, each insulated wire may have an inner bond wire core diameter and an outer diameter that includes the insulator coating. In some embodiments, as shown, the inner diameter and outer diameter of each insulated wire may be the same for each wire, shown as D1 for the inner diameter and D2 for the outer diameter. The inner and/or outer diameter may vary between wires in some embodiments. In some embodiments, the outer diameter, D2, may be approximately 25 microns. The outer diameter may be smaller or larger in various embodiments. The outer diameter, D2, and the inner diameter, D1, are not shown to scale. In some embodiments, the insulator coatings may be thinner or thicker in relation to the bond wire cores than shown.

In some embodiments, the first insulated wire 402 may be in contact with the second insulated wire 402 at a first location 426; the second insulated wire 404 may be in contact with the third insulated wire 406 at a second location 428; and the third insulated wire 406 may be in contact with the fourth insulated wire 408 at a third location 430. In various embodiments, the plurality of insulated wires 400 may correspond to a cross-section of the first plurality of insulated wires 126 in the gathered region 136, the second plurality of insulated wires 127 in the gathered region 137, or the plurality of insulated wires 326 in the gathered region 336 shown and described with respect to FIG. 1 or FIG. 3.

Figure 5:
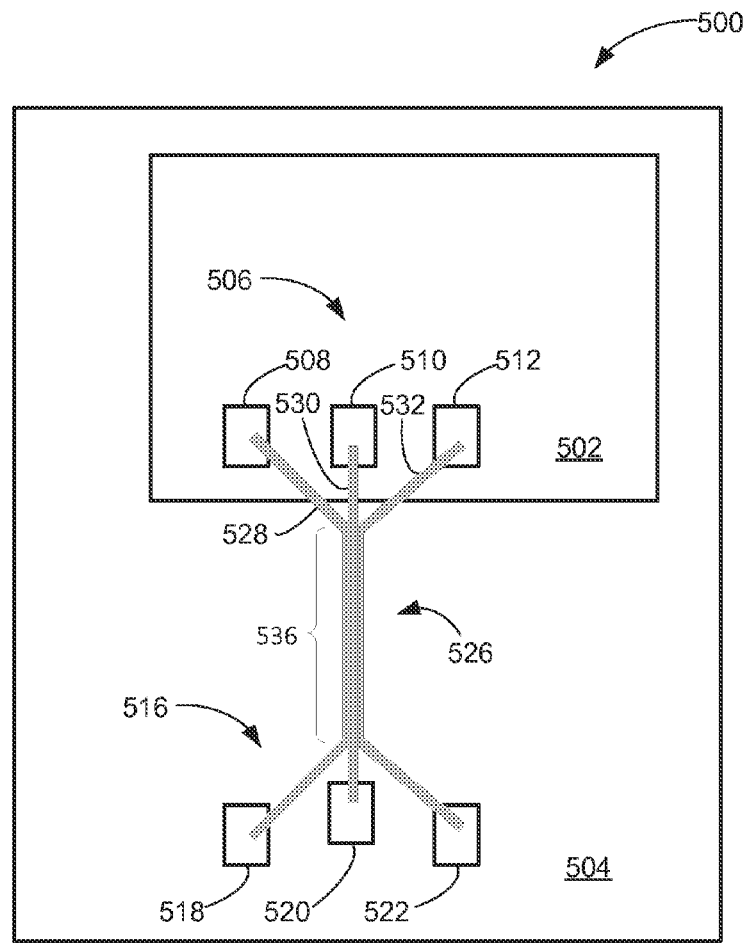
FIG. 5 schematically illustrates a top view of an IC package assembly with gathered insulated wires in a stacked configuration, in accordance with some embodiments.

FIG. 5 schematically illustrates a top view of an IC package assembly 500 with gathered insulated wires in a stacked configuration, in accordance with some embodiments. In various embodiments, the IC package assembly 500 may include one or more dies 502 that may be electrically and/or physically coupled with a PCB 504. In some embodiments, the die 502 may include a plurality of die pads 506 that may include a first die pad 508, a second die pad 510, and a third die pad 512. The PCB 504 may include a plurality of PCB pads 516 that may include a first PCB pad 518, a second PCB pad 520, and a third PCB pad 522.

In some embodiments, the die 502 may be electrically coupled with the PCB 504 with a plurality of insulated wires 526 electrically coupling the plurality of die pads 506 to the plurality of PCB pads 516. As shown, a first insulated wire 528 may have a first end coupled with the first die pad 508 and a second end coupled with the first PCB pad 518. A second insulated wire 530 may have a first end coupled with the second die pad 510 and a second end coupled with the second PCB pad 520. A third insulated wire 532 may have a first end coupled with the third die pad 512 and a second end coupled with the third PCB pad 522.

In some embodiments, the plurality of insulated wires 526 may be coupled with the plurality of die pads 506 and the plurality of PCB pads 516 by wire bonding. In various embodiments, the insulated wires 526 may be ball bonded or wedge bonded. As shown, the plurality of insulated wires 526 may extend in parallel along a gathered region 536. In some embodiments, the plurality of insulated wires 526 may be in a stacked configuration in time gathered region 536 such that an outer surface of the first insulated wire 528 may be in contact with both an outer surface of the second insulated wire 530 and an outer surface of the third insulated wire 532 along at least a portion of the gathered region 536, with the outer surface of the second insulated wire 530 also in contact with both an outer surface of the first insulated wire 528 and an outer surface of the third insulated wire 532 along at least a portion of the gathered region 536.

Although the plurality of insulated wires 526 are shown as being in contact in the gathered region 536, in some embodiments, the insulated wires 526 may not be in contact with each other but may be located such that an outer surface of the second insulated wire 530 is located at a distance of less than an outer cross-sectional diameter of the second insulated wire 530 from an outer surface of the first insulated wire 528 at a first location in the gathered region 536, the outer surface of the second insulated 530 wire is located at a distance of less than the outer cross-sectional diameter of the second insulated wire 530 from an outer surface of the third insulated wire 532 at a second location in the gathered region 536, and the outer surface of the first insulated wire 528 is located at a distance of less than an outer cross-sectional diameter of the first insulated wire 528 from an outer surface of the third insulated wire 532 at a third location in the gathered region 536. In various embodiments, an adhesive, such as an epoxy based material, may cover at least a portion of the gathered region 536.

In some embodiments, the first insulated wire 528 and the third insulated wire 532 may be a differential signal wire pair and the second insulated wire 530 may be a ground (Vss) wire. The second insulated wire 530 may be shorter than the first insulated wire 528 and the third insulated wire 532 in various embodiments. Although the second insulated wire 530 is shown running on top of the first insulated wire 528 and the third insulated wire 532, the second insulated wire 530 may run below the first insulated wire 528 and the third insulated wire 532 in some embodiments. In some embodiments, additional ground wires may be added or stacked around the differential signal wire pair.

Figures 6, 7:
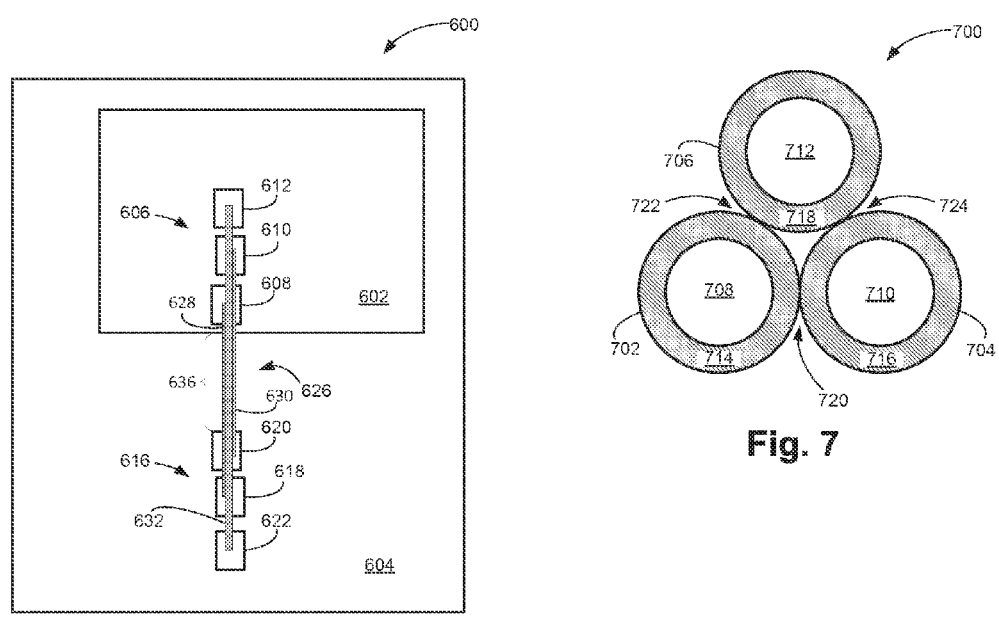
FIG. 6 schematically illustrates a top view of an example IC package assembly with die pads in a staggered configuration and gathered insulated wires in a stacked configuration, in accordance with some embodiments.
FIG. 7 schematically illustrates a cross-section side view of gathered insulated wires in a stacked configuration, in accordance with some embodiments.

FIG. 6 schematically illustrates a top view of an example IC package assembly 600 with die pads in a staggered configuration and gathered insulated wires in a stacked configuration, in accordance with some embodiments. In various embodiments, the IC package assembly 600 may include one or more dies 602 that may be electrically and/or physically coupled with a PCB 604. In some embodiments, the die 602 may include a plurality of die pads 606 that may include a first die pad 608, a second die pad 610, and a third die pad 612. The PCB 604 may include a plurality of PCB pads 616 that may include a first PCB pad 618, a second PCB pad 620, and a third PCB pad 622.

In some embodiments, the die 602 may be electrically coupled with the PCB 604 with a plurality of insulated wires 626 electrically coupling the plurality of die pads 606 to the plurality of PCB pads 616. As shown, a first insulated wire 628 may have a first end coupled with the first die pad 608 and a second end coupled with the first PCB pad 618. A second insulated wire 630 may have a first end coupled with the second die pad 610 and a second end coupled with the second PCB pad 620. A third insulated wire 632 may have a first end coupled with the third die pad 612 and a second end coupled with the third PCB pad 622.

In some embodiments, at least one of the plurality of die pads 606 or the plurality of PCB pads 616 may be arranged in a configuration with at least one of the die pads or PCB pads spaced apart from at least one of the other die pads or PCB pads in a direction that extends longitudinally with respect to at least one of the plurality of insulated wires 626. As shown, in various embodiments, the first die pad 608, the second die pad 610, and the third die pad 612 may be spaced apart from each other along a direction that extends longitudinally along the plurality of insulated wires 626. In some embodiments, the first PCB pad 618, the second PCB pad 620, and the third PCB pad 622 may be similarly spaced apart from each other along the direction extending longitudinally along the plurality of insulated wires 626, as shown.

In some embodiments, the plurality of insulated wires 626 may be coupled with the plurality of die pads 606 and the plurality of PCB pads 616 by wire bonding. In various embodiments, the insulated wires 626 may be ball bonded or wedge bonded. As shown, the plurality of insulated wires 626 may extend in parallel along a gathered region 636. In some embodiments, the plurality of insulated wires 626 may be in a stacked configuration in the gathered region 636 such that an outer surface of the first insulated wire 628 may be in contact with both an outer surface of the second insulated wire 630 and an outer surface of the third insulated wire 632 along at least a portion of the gathered region 636, with the outer surface of the second insulated wire 630 also in contact with both an outer surface of the first insulated wire 628 and an outer surface of the third insulated wire 632 along at least a portion of the gathered region 636.

FIG. 7 schematically illustrates a cross-section side view of gathered insulated wires 700 in a stacked configuration, in accordance with some embodiments. In some embodiments, the plurality of gathered insulated wires 700 may include a first insulated wire 702, a second insulated wire 704, and a third insulated wire 706. In various embodiments, each of the insulated wires 702, 704, and 706 may include a bond wire core 708, 710, or 712, respectively, which may be made of copper, gold, or another electrically conductive material, for example. In various embodiments, each of the insulated wires 702, 704, and 706 may have an insulator coating 714, 716, or 718, respectively, that may be formed of a material based on an epoxy or polyamide, for example. In various embodiments, each insulated wire may have an inner bond wire core diameter and an outer diameter that includes the insulator coating. In some embodiments, as shown, the inner diameter and outer diameter of each insulated wire may be the same for each wire. The inner and/or outer diameter may vary between wires in some embodiments.

In some embodiments, the first insulated wire 702 may be in contact with the second insulated wire 704 at a first location 720; the first insulated wire 702 may be in contact with the third insulated wire 706 at a second location 722; and the second insulated wire 704 may be in contact with the third insulated wire 706 at a third location 724. In various embodiments, the plurality of insulated wires 700 may correspond to a cross-section of the plurality of insulated wires 526 in the gathered region 536 shown and described with respect to FIG. 5, or the plurality of insulated wires 626 in the gathered region 636 shown and described with respect to FIG. 6.

Figure 8:
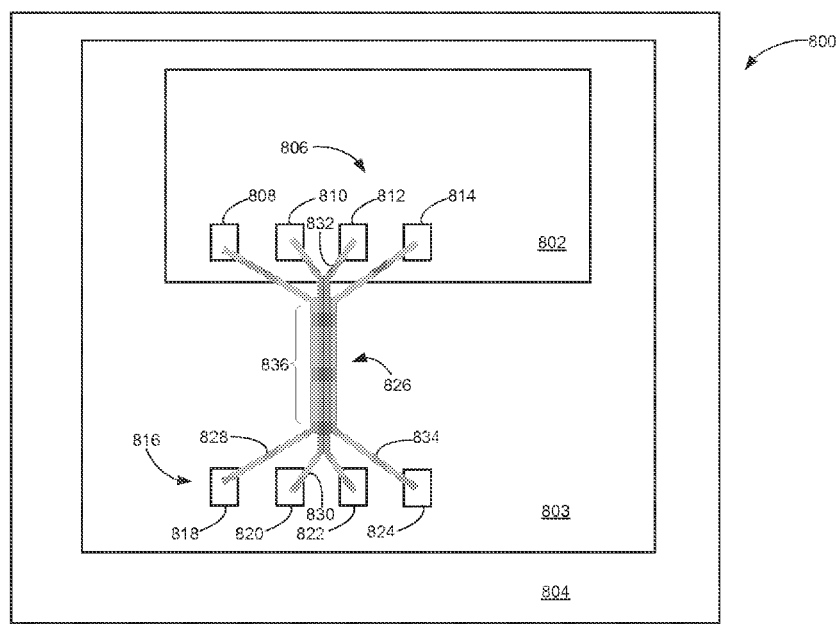
FIG. 8 schematically illustrates a top view of an example IC package assembly with gathered insulated wires coupled with a package substrate, in accordance with some embodiments.

FIG. 8 schematically illustrates a top view of an example IC package assembly 800 with gathered insulated wires coupled with a package substrate, in accordance with some embodiments. In various embodiments, the IC package assembly 800 may include one or more dies 802 that may be electrically and/or physically coupled with a package 803 (sometimes referred to as a "package substrate"). In some embodiments, the die 802 may include a plurality of die pads 806 that may include a first die pad 808, a second die pad 810, a third die pad 812, and a fourth die pad 814. The package 803 may include a plurality of substrate pads 816 that may include a first substrate pad 818, a second substrate pad 820, a third substrate pad 822, and a fourth substrate pad 824.

In some embodiments, the die 802 may be electrically coupled with the package 803 with a plurality of insulated wires 826 electrically coupling the plurality of die pads 806 to the plurality of substrate pads 816. As shown, a first insulated wire 828 may have a first end coupled with the first die pad 808 and a second end coupled with the first PCB pad 818. A second insulated wire 830 may have a first end coupled with the second die pad 810 and a second end coupled with the second PCB pad 820. A third insulated wire 832 may have a first end coupled with the third die pad 812 and a second end coupled with the third PCB pad 822. A fourth insulated wire 834 may have a first end coupled with the fourth die pad 814 and a second end coupled with the fourth PCB pad 824.

In various embodiments, the plurality of insulated wires 826 may be coupled with the plurality of die pads 806 and the plurality of PCB pads 816 by wire bonding. In some embodiments, the insulated wires 826 may be ball bonded or wedge bonded. As shown, the plurality of insulated wires 826 may extend in parallel along a gathered region 836. In some embodiments, the plurality of insulated wires 826 may be in a ribbon configuration in the gathered region 836 such that that an outer surface of the second insulated wire 830 may be in contact with an outer surface of the first insulated wire 828 and an outer surface of the third insulated wire 832, with the outer surface of the third insulated wire 832 also in contact with an outer surface of the fourth insulated wire 834.

Although the plurality of insulated wires 826 are shown as being in contact in the gathered region 836, in some embodiments, the insulated wires 826 may not be in contact with each other but may be located such that an outer surface of the second insulated wire 830 is located at a distance of less than an outer cross-sectional diameter of the second insulated wire 830 from an outer surface of the first insulated wire 828 at a first location in the gathered region 836 and the outer surface of the second insulated wire 830 is located at a distance of less than the outer cross-sectional diameter of the second insulated wire 830 from an outer surface of the third insulated wire 832 at a second location in the gathered region 836. In various embodiments, an adhesive, such as an epoxy based material, may cover at least a portion of the gathered region 836.

Figure 9:
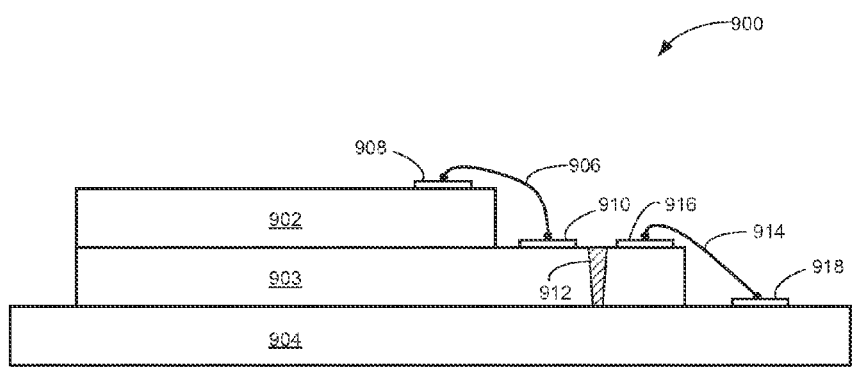
FIG. 9 schematically illustrates a side view of an example IC package assembly with gathered insulated wires coupled with a package substrate, in accordance with some embodiments.

FIG. 9 schematically illustrates a side view of an example IC package assembly 900 with gathered insulated wires coupled with a package substrate, in accordance with some embodiments. In various embodiments, the IC package assembly 900 may include one or more IC dies (hereinafter "die 902") electrically and/or physically coupled with a package 903 (sometimes referred to as a "package substrate"). In some embodiments, the package 903 may be electrically coupled with a PCB 904. In various embodiments, the package 903 may include another IC die mounted in a flip-chip configuration on the PCB 904 such that the die 902 is mounted on the PCB 904 along with the package 903 including the other die in a chip-on-chip (COC) configuration. In some embodiments, the package 903 may include a via 912 electrically coupled with the PCB 904 and/or the package assembly may be electrically coupled with the PCB 904 with a plurality of wires that may include an insulated wire 914 wire bonded to a substrate pad 916 on the package substrate and a PCB pad 918 on the PCB 904.

In various embodiments, the die 902 may be coupled with the package 903 using a plurality of gathered insulated wires having first ends wire bonded to a plurality of die pads on the die and second ends wire bonded to a plurality of substrate pads on the package 903. As shown, the plurality of insulated wires may include insulated wire 906, the plurality of die pads may include die pad 908, and the plurality of substrate pads may include substrate pad 910. In some embodiments, the IC package assembly 900 may be a side view of the IC package assembly 800 shown in FIG. 8, with the die 902 corresponding to the die 802; package 903 corresponding to the package 803; the PCB 904 corresponding to the PCB 804; the insulated wire 906 corresponding to the first insulated wire 828; the die pad 908 corresponding to the first die pad 808; and the substrate pad 910 corresponding to the first substrate pad 818.

Figure 10:
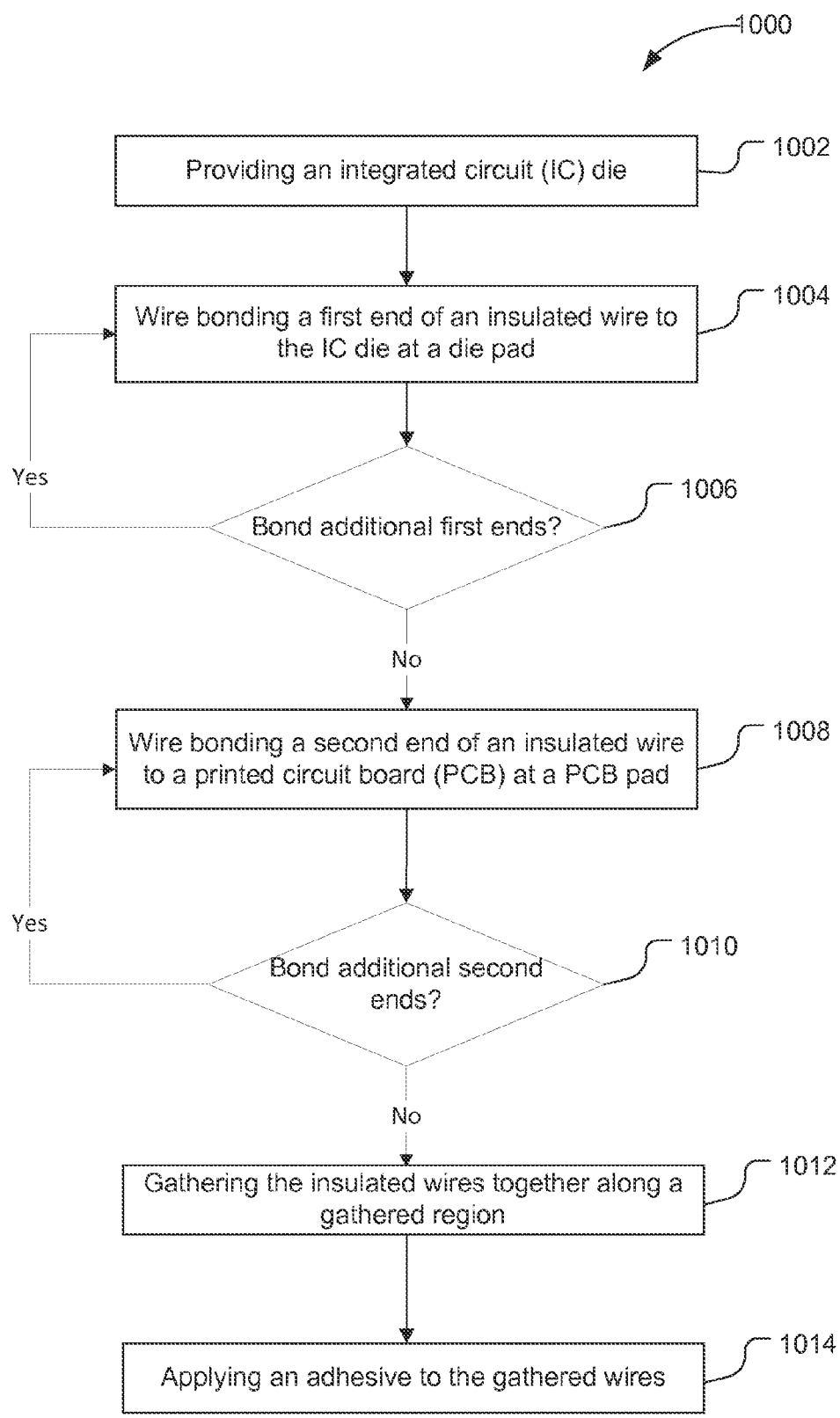
FIG. 10 schematically illustrates a flow diagram for a method of fabricating an IC package assembly, in accordance with some embodiments.

FIG. 10 schematically illustrates a flow diagram for a method 1000 of fabricating an IC package assembly (e.g., the IC package assembly 100, 200, 300, 500, 600, 800 or 900 of FIG. 1, 2, 3, 5, 6, 8, or 9), in accordance with various embodiments. The method 1000 may comport with configurations and techniques described in connection with FIGS. 2-9 and vice versa.

At a block 1002, an IC die may be provided. The IC die may be a die such as the IC die 102, the die 202, the die 302, the die 502, the die 602, the die 802, or the die 902 described with respect to FIG. 1, 2, 3, 5, 6, 8, or 9, for example. In some embodiments, the provided IC die may already include die pads. However, in various embodiments, the process 1000 may include forming die pads on the die. In some embodiments, the die pads may be formed in a staggered configuration such as that described with respect to the die 302 of FIG. 3 or the die 602 of FIG. 6, for example.

At a block 1004, a first end of an insulated wire may be wire bonded to a die pad on the IC die. At a decision block 1006, it may be determined whether additional first ends of insulated wires are to be wire-bonded to the IC die. If, at the decision block 1006, it is determined that additional first ends of insulated wires are to be wire bonded to the IC die, the process 1000 may return to the block 1004 where a first end of another insulated wire may be wire bonded to a die pad on the die. If, at the decision block 1006, it is determined that no additional first ends of insulated wires are to be wire bonded to the IC die, the process 1000 may proceed to a block 1008 where a second end of an insulated wire having a first end wire-bonded to the IC die may be wire bonded to a pad on a printed circuit board (PCB). At a decision block 1010, it may be determined whether additional second ends of insulated wires are to be wire-bonded to the PCB.

If, at the decision block 101, it is determined that additional second ends of insulated wires are to be wire-bonded to the PCB, the process 1000 may return to the block 1008 where a second end of another of the insulated wires may be wire bonded to the PCB. In some embodiments, the second ends of the insulated wires may be wire bonded to a package substrate rather than the PCB. If, at the decision block 1010, it is determined that no additional second ends of the insulated wires are to be wire bonded, the process 1000 may proceed to a block 1012 where the insulated wires may be gathered together. In some embodiments, the insulated wires may be routed in a gathered configuration before or while wire bonding rather than gathering the insulated wires together after wire bonding. At a block 1014, an adhesive may be applied to the gathered insulated wires.

Figure 11:
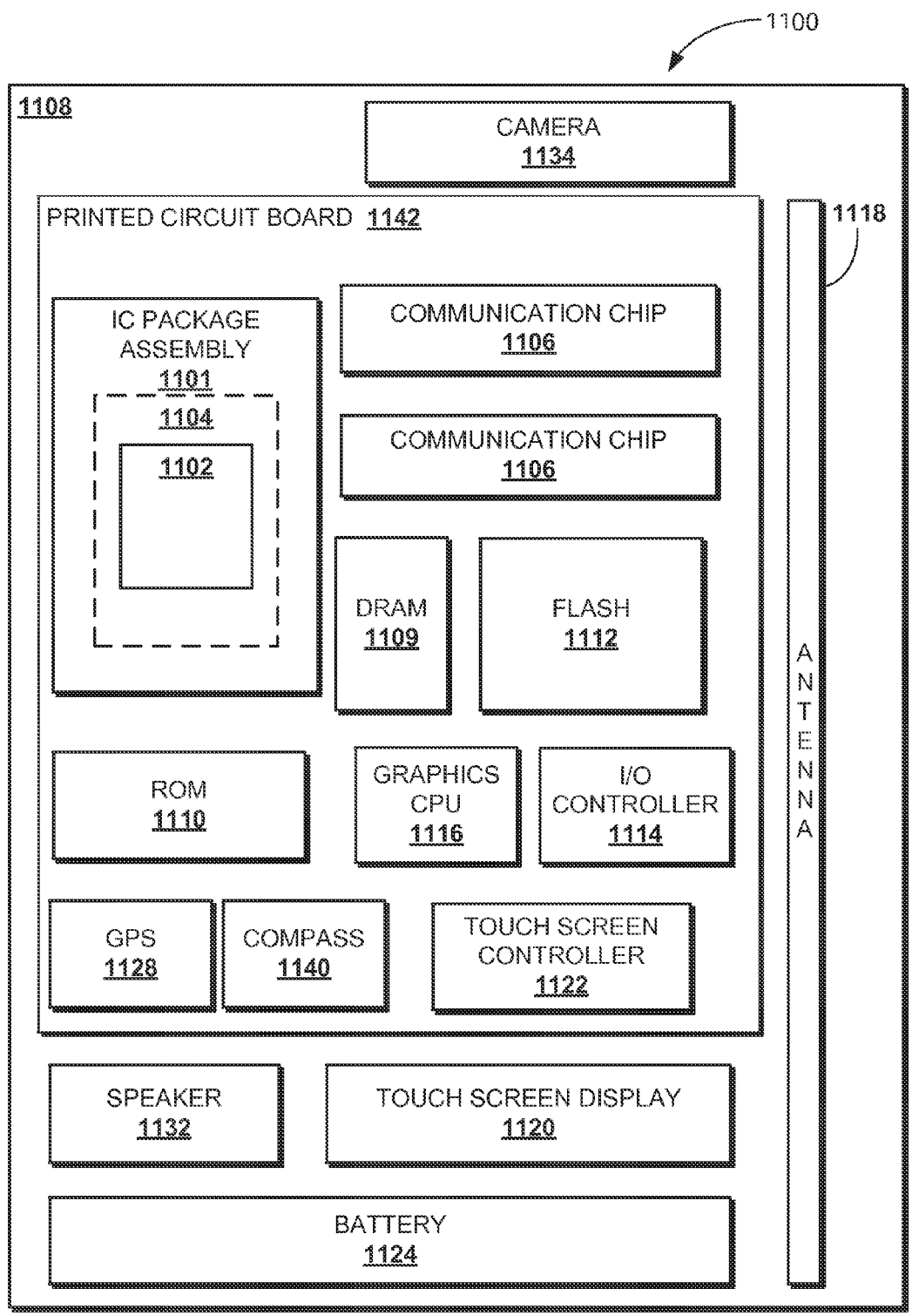
FIG. 11 schematically illustrates a computing device that includes an IC package assembly having a wire bond interconnect structure as described herein, in accordance with some embodiments.

Embodiments of the present disclosure may be implemented into a system using any suitable hardware and/or software to configure as desired. FIG. 11 schematically illustrates an example computing device 1100 that includes an IC package assembly 1101 having gathered insulated wires (e.g., IC package assembly 100, 200, 300, 500, 600, 800, or 900 of FIG. 1, 2, 3, 5, 6, 8, or 9) as described herein, in accordance with some embodiments. The IC package assembly 1101 may include a substrate 1104 having a bi-layer dielectric structure such as the dielectric structure 202. The substrate 1104 may be coupled with a die 1102 that may be similar to the die 102, the die 202, the die 302, the die 502, the die 602, the die 802, or the die 902 described with respect to FIG. 1, 2, 3, 5, 6, 8, or 9, for example. In some embodiments, the die 1102 may include a processor of the computing device 1100. In some embodiments, the term "processor" may refer to any device or portion of a device that processes electronic data from registers and/or memory to transform that electronic data into other electronic data that may be stored in registers and/or memory. The processor may include one or more processing cores in various embodiments.

In some embodiments, at least one communication chip 1106 may be physically and electrically coupled with the IC package assembly 1101. In some embodiments, the communication chip 1106 may be a part of the IC package assembly 1101 (e.g., as an additional die on or embedded in build-up layers in IC package assembly 1101). In various embodiments, the computing device 1100 may include a board such as a printed circuit board (PCB) 1142 that may be in a housing 1108 in some embodiments. In some embodiments, the board may be a motherboard. The IC package assembly 1101 or the communication chip 1106 may be disposed on the PCB 1142 in some embodiments. In various embodiments, the die 1102 may be wire bonded to the PCB 1142 or the substrate 1104 with gathered insulated wires as described with respect to FIGS. 1-10. Various components of the computing device 1100 may be coupled with each other without employment of the PCB 1142 in some embodiments.

Depending on its applications, the computing device 1100 may include other components that may or may not be physically or electrically coupled with the PCB 1142. These other components may include, but are not limited to, volatile memory (e.g., dynamic random access memory 1109, also referred to as "DRAM"), non-volatile memory (e.g., read only memory 1110, also referred to as "ROM"), flash memory 1112, an input/output controller 1114, a digital signal processor (not shown), a crypto processor (not shown), a graphics processor 1116, one or more antenna 1118, a display (not shown), a touch screen display 1120, a touch screen controller 1122, a battery 1124, an audio codec (not shown), a video codec (not shown), a chipset (not shown), a power amplifier (not shown), a global positioning system ("GPS") device 1128, a compass 1140, an accelerometer (not shown), a gyroscope (not shown), a speaker 1132, a camera 1134, or a mass storage device (such as hard disk drive, a solid state drive, compact disk (CD), digital versatile disk (DVD), and so forth) (not shown). In some embodiments, various components may be integrated with other components to form a system-on-chip ("SoC"). In some embodiments, some components, such as DRAM 1109, may be embedded in the IC package assembly 1101.

The communication chip 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Institute for Electrical and Electronic Engineers (IEEE) standards including WiGig, Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide interoperability for Microwave Access, which is a certification mark for products that pass conformity and interoperability tests for the IEEE 802.16 standards. The communication chip 1106 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 906 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1106 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1106 may operate in accordance with other wireless protocols in other embodiments.

The computing device 1100 may include a plurality of communication chips 1106. For instance, a first communication chip 1106 may be dedicated to shorter range wireless communications such as WiGig, Wi-Fi, and Bluetooth and a second communication chip 1106 may be dedicated to longer range wireless communications such as GPS, EDGE, GPRS, CDMA, WiMAX, LTE, EV-DO, and others.

In various implementations, the computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1100 may be a mobile computing device in some embodiments. In further implementations, the computing device 1100 may be any other electronic device that processes data.

EXAMPLES

Example 1 may include an integrated circuit (IC) package assembly comprising: an IC die; a first insulated wire having a first end wire bonded with the IC die at a first die pad; a second insulated wire having an outer cross-sectional diameter and a first end wire bonded with the IC die at a second die pad; and a third insulated wire having a first end wire bonded with the IC die at a third die pad, wherein: the first, second, and third die pads are disposed on the IC die and are separate from each other; an outer surface of the second insulated wire is located at a distance of less than the outer cross-sectional diameter of the second insulated wire from an outer surface of the first insulated wire at a first location; and the outer surface of the second insulated wire is located at a distance of less than the outer cross-sectional diameter of the second insulated wire from an outer surface of the third insulated wire at a second location.

Example 2 may include the subject matter of Example 1, wherein: the first, second, and third insulated wires extend in parallel along a gathered region; the first insulated wire touches both the second insulated wire and the third insulated wire along at least a portion of the gathered region; and the second insulated wire touches both the first insulated wire and the third insulated wire along at least a portion of the gathered region.

Example 3 may include the subject matter of Example 2, wherein the second insulated wire is shorter than the first insulated wire and the third insulated wire.

Example 4 may include the subject matter of Example 2, wherein the first insulated wire is a ground wire and the second and third insulated wires are a differential signal wire pair.

Example 5 may include the subject matter of Example 1, further comprising a fourth insulated wire having a first end wire bonded with the IC die at a fourth die pad, wherein: the first, second, third, and fourth insulated wires extend in parallel along a gathered region; the first insulated wire touches the second insulated wire along at least a portion of the gathered region; and the third insulated wire touches both the second insulated wire and the fourth insulated wire along at least a portion of the gathered region.

Example 6 may include the subject matter of Example 5, wherein: the first, second, third, and fourth die pads are spaced apart in a first direction; and at least one of the first, second, third, and fourth die pads are spaced apart in a second direction with respect to at least one of the other of the first, second, third, and fourth die pads.

Example 7 may include the subject matter of Example 5, wherein the first and fourth insulated wires are ground wires and the second and third insulated wires are a differential signal wire pair.

Example 8 may include the subject matter of any one of Examples 2-7, wherein at least one of the first, second, and third insulated wires is less than or equal to 700 microns in length.

Example 9 may include the subject matter of any one of Examples 2-7, further comprising a package substrate, wherein: the first insulated wire includes a second end wire bonded with the package substrate at a first substrate pad; the second insulated wire includes a second end wire bonded with the package substrate at a second substrate pad; and the third insulated wire includes a second end wire bonded with the package substrate at a third substrate pad.

Example 10 may include the subject matter of any one of Examples 2-7, further comprising a printed circuit board (PCB), wherein: the first insulated wire includes a second end wire bonded with the PCB at a first PCB pad; the second insulated wire includes a second end wire bonded with the PCB at a second PCB pad; and the third insulated wire includes a second end wire bonded with the PCB at a third PCB pad.

Example 11 may include a method of fabricating an integrated circuit (IC) package assembly, the method comprising: providing an IC die; wire bonding a first end of a first insulated wire to the IC die at a first pad; wire bonding a first end of a second insulated wire having an outer cross-sectional diameter to the IC die at a second pad; wire bonding a first end of a third insulated wire to the IC die at a third pad; and gathering the first, second, and third wires together along a gathered region, wherein: the first, second, and third pads are separate from each other; an outer surface of the second insulated wire is located at a distance of less than the outer cross-sectional diameter of the second insulated wire from an outer surface of the first insulated wire along at least a portion of the gathered region; and the outer surface of the second insulated wire is located at a distance of less than the outer cross-sectional diameter of the second insulated wire from an outer surface of the third insulated wire along at least a portion of the gathered region.

Example 12 may include the subject matter of Example 11, wherein: the first, second, and third insulated wires extend in parallel along the gathered region; and the first insulated wire touches both the second insulated wire and the third insulated wire along at least a portion of the gathered region.

Example 13 may include the subject matter of Example 12, wherein the first insulated wire is a ground wire and the second and third insulated wires are a differential signal wire pair.

Example 14 may include the subject matter of Example 11, further comprising wire bonding a first end of a fourth insulated wire to the IC at a fourth die pad, wherein: the first, second, third, and fourth insulated wires extend in parallel along a gathered region; the first insulated wire touches the second insulated wire along at least a portion of the gathered region; and the third insulated wire touches both the second insulated wire and the fourth insulated wire along at least a portion of the gathered region.

Example 15 may include the subject matter of Example 14, wherein: the first, second, third, and fourth die pads are spaced apart in a first direction; and at least one of the first, second, third, and fourth die pads are spaced apart in a second direction with respect to at least one of the other of the first, second, third, and fourth die pads.

Example 16 may include the subject matter of Example 14, wherein the first and fourth insulated wires are ground wires and the second and third insulated wires are a differential signal wire pair.

Example 17 may include the subject matter of any one of Examples 12-16, wherein at least one of the first, second, and third insulated wires is less than or equal to 700 microns in length.

Example 18 may include the subject matter of any one of Examples 12-16, further comprising: wire bonding a second end of the first insulated wire to a package substrate at a first substrate pad; wire bonding a second end of the second insulated wire to a package substrate at a second substrate pad; wire bonding a second end of the third insulated wire to a package substrate at a third substrate pad.

Example 19 may include a computing device comprising: a circuit board; and
an integrated circuit (IC) package assembly coupled with the circuit board, the IC package assembly including: an IC die; a first insulated wire having a first end wire bonded with the IC die at a first die pad; a second insulated wire having an outer cross-sectional diameter and a first end wire bonded with the IC die at a second die pad; and a third insulated wire having a first end wire bonded with IC die at a third die pad, wherein: the first, second, and third die pads are disposed on the IC die; an outer surface of the second insulated wire is located at a distance of less than the outer cross-sectional diameter of the second insulated wire from an outer surface of the first insulated wire at a first location; and the outer surface of the second insulated wire is located at a distance of less than the outer cross-sectional diameter of the second insulated wire from an outer surface of the third insulated wire at a second location.

Example 20 may include the subject matter of Example 19, wherein: the first insulated wire includes a second end wire bonded with the circuit board; the second insulated wire includes a second end wire bonded with the circuit board; and the third insulated wire includes a second end wire bonded with the circuit board.

Example 21 may include the subject matter of Example 20, wherein: the first, second, and third insulated wires extend in parallel along a gathered region; and the first insulated wire touches both the second insulated wire and the third insulated wire along at least a portion of the gathered region; and the second insulated wire touches both the first insulated wire and the third insulated wire along at least a portion of the gathered region.

Example 22 may include the subject matter of Example 20, wherein the IC package assembly further includes a fourth insulated wire having a first end wire bonded with the IC die at a fourth die pad, wherein: the first, second, third, and fourth insulated wires extend in parallel along a gathered region; the first insulated wire touches the second insulated wire along at least a portion of the gathered region; and the third insulated wire touches both the second insulated wire and the fourth insulated wire along at least a portion of the gathered region.

Example 23 may include the subject matter of Example 22, wherein: the first, second, third, and fourth die pads are spaced apart in a first direction; and at least one of the first, second, third, and fourth die pads are spaced apart in a second direction with respect to at least one of the other of the first, second, third, and fourth die pads.

Example 24 may include the subject matter of any one of Examples 19-23, wherein: the first insulated wire is a ground wire; and the second and third insulated wires are a differential signal wire pair.

Example 25 may include the subject matter of any one of Examples 19-23, wherein: the computing device is a mobile computing device including, coupled with the circuit board, a display, a touchscreen display, a touchscreen controller, a battery, a global positioning system device, a compass, a speaker, or a camera.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

What is claimed is:

1. An integrated circuit (IC) package assembly comprising:
    an IC die;
    a first insulated wire having a first end wire bonded with the IC die at a first die pad;
    a second insulated wire having an outer cross-sectional diameter and a first end wire bonded with the IC die at a second die pad; and
    a third insulated wire having a first end wire bonded with the IC die at a third die pad, wherein:
    the first, second, and third die pads are disposed on the IC die and are separate from each other;
    an outer surface of the second insulated wire is located at a distance of less than the outer cross-sectional diameter of the second insulated wire from an outer surface of the first insulated wire at a first location; and
    the outer surface of the second insulated wire is located at a distance of less than the outer cross-sectional diameter of the second insulated wire from an outer surface of the third insulated wire at a second location.

2. The IC package assembly of claim 1, wherein:
    the first, second, and third insulated wires extend in parallel along a gathered region;
    the first insulated wire touches both the second insulated wire and the third insulated wire along at least a portion of the gathered region; and
    the second insulated wire touches both the first insulated wire and the third insulated wire along at least a portion of the gathered region.

3. The IC package assembly of claim 2, wherein the second insulated wire is shorter than the first insulated wire and the third insulated wire.

4. The IC package assembly of claim 2, wherein the first insulated wire is a ground wire and the second and third insulated wires are a differential signal wire pair.

5. The IC package assembly of claim 1, further comprising a fourth insulated wire having a first end wire bonded with the IC die at a fourth die pad, wherein:
    the first, second, third, and fourth insulated wires extend in parallel along a gathered region;
    the first insulated wire touches the second insulated wire along at least a portion of the gathered region; and
    the third insulated wire touches both the second insulated wire and the fourth insulated wire along at least a portion of the gathered region.

6. The IC package assembly of claim 5, wherein:
    the first, second, third, and fourth die pads are spaced apart in a first direction; and
    at least one of the first, second, third, and fourth die pads are spaced apart in a second direction with respect to at least one of the other of the first, second, third, and fourth die pads.

7. The IC package assembly of claim 5, wherein the first and fourth insulated wires are ground wires and the second and third insulated wires are a differential signal wire pair.

8. The IC package assembly of claim 2, wherein at least one of the first, second, and third insulated wires is less than or equal to 700 microns in length.

9. The IC package assembly of claim 2, further comprising a package substrate, wherein:
    the first insulated wire includes a second end wire bonded with the package substrate at a first substrate pad;
    the second insulated wire includes a second end wire bonded with the package substrate at a second substrate pad; and
    the third insulated wire includes a second end wire bonded with the package substrate at a third substrate pad.

10. The IC package assembly of claim 2, further comprising a printed circuit board (PCB), wherein:

the first insulated wire includes a second end wire bonded with the PCB at a first PCB pad;

the second insulated wire includes a second end wire bonded with the PCB at a second PCB pad; and the third insulated wire includes a second end wire bonded with the PCB at a third PCB pad.

11. A method of fabricating an integrated circuit (IC) package assembly, the method comprising:

providing an IC die;

wire bonding a first end of a first insulated wire to the IC die at a first pad;

wire bonding a first end of a second insulated wire having an outer cross-sectional diameter to the IC die at a second pad;

wire bonding a first end of a third insulated wire to the IC die at a third pad; and gathering the first, second, and third wires together along a gathered region, wherein:

the first, second, and third pads are separate from each other;

an outer surface of the second insulated wire is located at a distance of less than the outer cross-sectional diameter of the second insulated wire from an outer surface of the first insulated wire along at least a portion of the gathered region; and the outer surface of the second insulated wire is located at a distance of less than the outer cross-sectional diameter of the second insulated wire from an outer surface of the third insulated wire along at least a portion of the gathered region.

12. The method of fabricating an IC package assembly of claim 11, wherein:

the first, second, and third insulated wires extend in parallel along the gathered region; and the first insulated wire touches both the second insulated wire and the third insulated wire along at least a portion of the gathered region.

13. The method of fabricating an IC package assembly of claim 12, wherein the first insulated wire is a ground wire and the second and third insulated wires are a differential signal wire pair.

14. The method of fabricating an IC package assembly of claim 11, further comprising wire bonding a first end of a fourth insulated wire to the IC at a fourth die pad, wherein:

the first, second, third, and fourth insulated wires extend in parallel along a gathered region;

the first insulated wire touches the second insulated wire along at least a portion of the gathered region; and the third insulated wire touches both the second insulated wire and the fourth insulated wire along at least a portion of the gathered region.

15. The method of fabricating an IC package assembly of claim 14, wherein:

the first, second, third, and fourth die pads are spaced apart in a first direction; and at least one of the first, second, third, and fourth die pads are spaced apart in a second direction with respect to at least one of the other of the first, second, third, and fourth die pads.

16. The method of fabricating an IC package assembly of claim 14, wherein the first and fourth insulated wires are ground wires and the second and third insulated wires are a differential signal wire pair.

17. The method of fabricating an IC package assembly of claim 12, wherein at least one of the first, second, and third insulated wires is less than or equal to 700 microns in length.

18. The method of fabricating an IC package assembly of claim 12, further comprising:

wire bonding a second end of the first insulated wire to a package substrate at a first substrate pad;

wire bonding a second end of the second insulated wire to a package substrate at a second substrate pad;

wire bonding a second end of the third insulated wire to a package substrate at a third substrate pad.

19. A computing device comprising:

a circuit board; and an integrated circuit (IC) package assembly coupled with the circuit board, the IC package assembly including:

an IC die;

a first insulated wire having a first end wire bonded with the IC die at a first die pad;

a second insulated wire having an outer cross-sectional diameter and a first end wire bonded with the IC die at a second die pad; and a third insulated wire having a first end wire bonded with the IC die at a third die pad, wherein:

the first, second, and third die pads are disposed on the IC die;

an outer surface of the second insulated wire is located at a distance of less than the outer cross-sectional diameter of the second insulated wire from an outer surface of the first insulated wire at a first location; and the outer surface of the second insulated wire is located at a distance of less than the outer cross-sectional diameter of the second insulated wire from an outer surface of the third insulated wire at a second location.

20. The computing device of claim 19, wherein:

the first insulated wire includes a second end wire bonded with the circuit board;

the second insulated wire includes a second end wire bonded with the circuit board; and the third insulated wire includes a second end wire bonded with the circuit board.

21. The computing device of claim 20, wherein:

the first, second, and third insulated wires extend in parallel along a gathered region; and the first insulated wire touches both the second insulated wire and the third insulated wire along at least a portion of the gathered region; and the second insulated wire touches both the first insulated wire and the third insulated wire along at least a portion of the gathered region.

22. The computing device of claim 20, wherein the IC package assembly further includes a fourth insulated wire having a first end wire bonded with the IC die at a fourth die pad, wherein:

the first, second, third, and fourth insulated wires extend in parallel along a gathered region;

the first insulated wire touches the second insulated wire along at least a portion of the gathered region; and the third insulated wire touches both the second insulated wire and the fourth insulated wire along at least a portion of the gathered region.

23. The computing device of claim 22, wherein:

the first, second, third, and fourth die pads are spaced apart in a first direction; and at least one of the first, second, third, and fourth die pads are spaced apart in a second direction with respect to at least one of the other of the first, second, third, and fourth die pads.

24. The computing device of claim 19, wherein:

the first insulated wire is a ground wire; and the second and third insulated wires are a differential signal wire pair.

25. The computing device of claim 19, wherein:
the computing device is a mobile computing device including, coupled with the circuit board, a display, a touchscreen display, a touchscreen controller, a battery, a global positioning system device, a compass, a speaker, or a camera.

* * * * *